United States Patent [19]

Dyck

[11] 4,398,301

[45] Aug. 9, 1983

[54] MULTIPLE PREAMPLIFIERS WITH INTERVENING OVERFLOW CELL FOR CHARGE COUPLED IMAGING DEVICES

[75] Inventor: Rudolph H. Dyck, Palo Alto, Calif.

[73] Assignee: Fairchild Camera & Instrument Corporation, Mountain View, Calif.

[21] Appl. No.: 186,108

[22] Filed: Sep. 11, 1980

[51] Int. Cl.$^3$ .................... G11C 19/28; H01L 29/78; H03K 3/353

[52] U.S. Cl. ........................................ 377/60; 357/24; 307/304

[58] Field of Search ............. 357/24; 307/221 D, 304; 377/60

[56] References Cited

U.S. PATENT DOCUMENTS 3,806,772  4/1974  Early .................................... 357/24 R
4,251,834  2/1981  Hall .................................. 357/24 LR Primary Examiner—Gene M. Munson
Attorney, Agent, or Firm—Kenneth Olsen; Michael J. Pollock; Carl L. Silverman

[57] ABSTRACT

Apparatus for amplifying output signals from a charge coupled area imaging device includes a resettable first floating gate amplifier connected to sense charge in the charge coupled device output register at a first location, a second floating gate amplifier connected to sense charge in the charge coupled device output register at a second location, and a charge limiting well disposed between the first location and the second location to remove charge in excess of a desired amount before the output signals are sensed at the second location. The dual preamplifiers permit optimization of the output signals from the charge coupled imaging device for two substantially different light levels by providing a substantially lower noise equivalent input signal level from the second preamplifier.

16 Claims, 6 Drawing Figures

MULTIPLE PREAMPLIFIERS WITH INTERVENING OVERFLOW CELL FOR CHARGE COUPLED IMAGING DEVICES

BACKGROUND OF THE INVENTION

1. Field of the Invention

This invention relates to charge coupled devices and in particular to a charge coupled imaging device in which the output signal is detected and amplified by a pair of floating gate preamplifiers separated by a charge limiting well. The first preamplifier may be adjusted for optimum detection of high level signals while the second operates on lower level signals. The charge limiting well prevents high level signals from reaching the second preamplifier.

2. Prior Art

Many types of charge coupled linear and area imaging devices are now well known. Such devices are readily commercially available and have been the subject of numerous patents. For example, Fairchild Camera and Instrument Corporation manufactures a wide variety of linear and area imaging devices ranging in size from product CCD111, a 1X256 linear imaging device, to produce CCD221, a 380×488 area imaging device.

The development of large area high resolution image sensors has been hindered, however, by the widely varying ambient lighting conditions such devices must sense. Such ambient lighting causes widely disparate amounts of charge to accumulate in different elements of the charge coupled image sensor. Prior to this invention sense amplifiers have not been able to efficiently detect and amplify disparate amounts of charge resulting from such different light levels.

Floating gate and distributed floating gate amplifiers for charge coupled image sensing are known. These operate by sensing the size of a signal charge packet by the image charge created in the electrically isolated, but proximate, floating gate electrode. Because floating gates sense the signal charge nondestructively, floating gate amplifiers can be distributed periodically along an output register to repeatedly detect the signal charge traveling through the register. This enhances the signal to noise ratio, but does not improve the ability of the amplifier to process widely varying signals accurately. Thus, floating gate amplifiers typically have provided a linear response over a large but sometimes inadequate range of charge densities. For example, the linear response of the floating gate amplifier in Fairchild product CCD221 accurately senses signals varying by four orders of magnitude. A brief summary of floating gate amplifier operation in charge coupled image sensors may be found beginning at page 56 of *Charge Transfer Devices* by Sequin and Tompsett, Academic Press, 1975.

SUMMARY OF THE INVENTION

This invention provides multiple preamplifiers and an intervening overflow cell or cells to permit sensing and amplifying widely varying quantities of charge with a combined dynamic range not previously available. In one embodiment the invention includes a first amplifier means positioned at a first location along the output register of a charge coupled imaging device, a second amplifier means positioned at a second location along the output register subsequent to the first location, and an intervening charge limiting means for removing excess charge after the output signal is sensed by the first amplifier means. In this manner the first amplifier means may be optimized to sense a range of quantity of charge having a larger maximum quantity of charge, while the second amplifier means may be optimized to sense a range of quantity of charge limited at the lower end by a lower noise level. Thus, the second amplifier may be used primarily to detect and amplify charge accumulated at lower light levels, while the first amplifier operates to detect and amplify charge accumulated at higher light levels. In this manner linear response may be achieved for widely varying amounts of charge. Because the amplifiers convert a charge signal into a voltage signal, the ability of the multiple preamplifiers to sense and amplify widely varying amounts of charge is made further accurate by minimizing the input capacitance of each amplifier. This is achieved by minimizing the dimensions of each floating gate and the underlying channel, and separating each gate or group of gates by a charge limiting well.

This invention provides a substantial increase in dynamic range over prior art charge coupled device amplifiers in which a single amplifier, or a single amplifier comprised of several stages, was used to detect the varying amounts of charge accumulated in different elements of the charge coupled device as a result of varying light conditions. The present invention is also advantageous relative to prior devices because the two (or more) amplifiers of this invention supply parallel output signals with different gain and noise characteristics permitting the overall system to be adjusted for optimum performance at any illumination condition.

The invention may be implemented in different forms. For example, a series of floating gate nodes may be disposed along an output register, with desired nodes or groups of nodes separated by charge limiting wells. Thus, a first sequence of floating gate amplifiers (hence a distributed floating gate amplifier) may be separated by a charge limiting well from a second sequence which, in turn, is separated from a third sequence by a charge limiting well. The sequence may be extended as long as desired.

DETAILED DESCRIPTION

Figure 1:
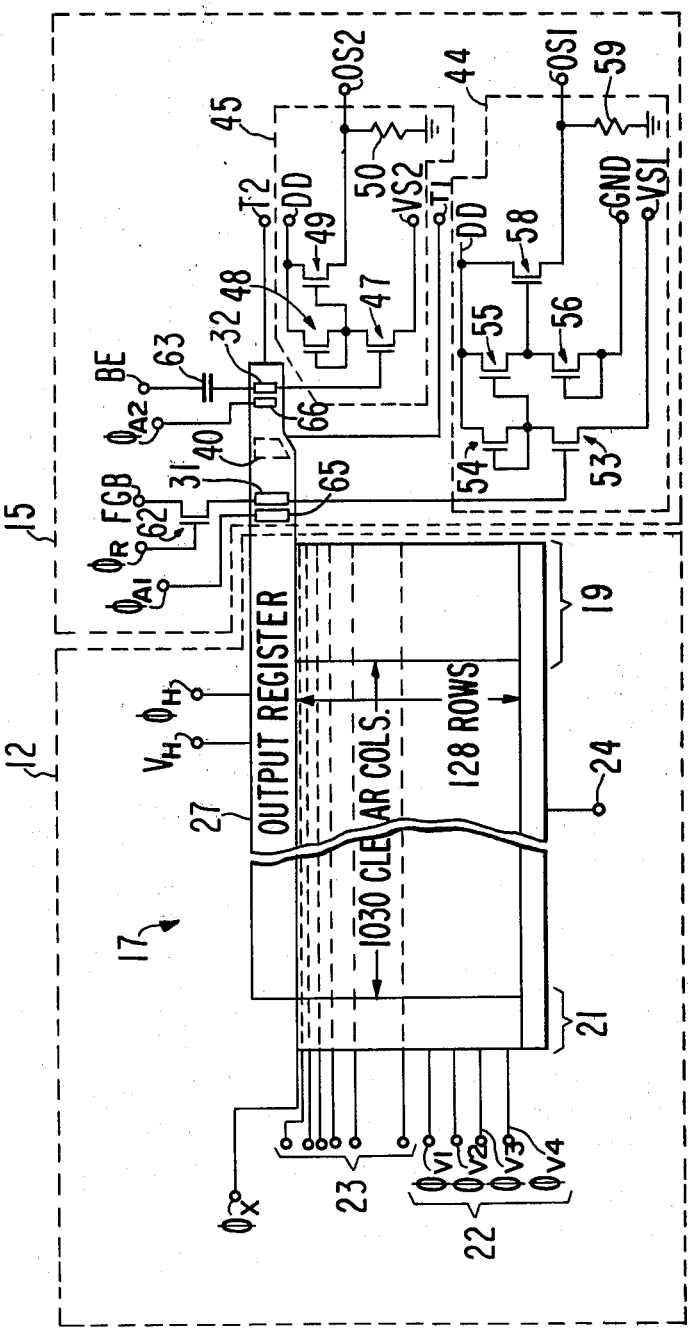
FIG. 1 is a schematic view of one embodiment of the invention used in conjunction with a 1030×128 charge coupled area imaging sensor.

FIG. 1 is a schematic view of one embodiment of the invention showing its application to the output register of a 1030×128 charge coupled area image sensor. The existing image sensor is shown as generally within dashed line 12 while the sense amplifier system of the invention is shown within dashed line 15. The area image sensor shown in block 12 is only for illustration, and any linear or area image sensor having an output register may be adapted to the invention.

Image sensor 17 accumulates charge in the 1030×128 array. Nine opaque columns 19 provide a dark current reference signal, and a dummy end register 21 minimizes edge effects in the last active column associated with dark signal and photoresponse. The illustrated device utilizes a four phase clocking system 22, exposure control signals 23 and an exposure control sink diode 24.

In operation, charge is transferred line by line into the output register 27 where it is scanned out serially at the desired data rate into the sense amplifier system 15. In one embodiment the image sensor shown in block 12 is fabricated utilizing two-level polycrystalline silicon gates, and a buried n-channel oxide isolated process with self-aligned barriers. Toward one end of output register 27 (a serial shift register), a first floating gate sense node 31 and a second floating gate sense node 32 are positioned in series. A register overflow cell 40 is positioned between sense nodes 31 and 32. The signal voltages from each floating gate 31 and 32 are supplied in parallel to amplifiers 44 and 45, respectively. The output from amplifier 44 appears on terminal OS1, while the output from amplifier 45 appears on terminal OS2. As will be explained, the output signals at OS1 and OS2 may be optimized for the illumination levels sensed by image sensor 17.

For the embodiment shown in FIG. 1 the first floating gate sense node 31 and first amplifier 44 are optimized for operation over the higher portion of the dynamic range of image sensor 17. The second floating gate sense node 32 and second amplifier 45 are optimized for low noise operation over the lower portion of the dynamic range. In one embodiment amplifier 44 is controlled by a ten megahertz clock signal with the higher portion of the dynamic range extending to approximately $10^6$ electrons per pixel. The low noise low frequency operation will typically be at a frequency on the order of 1–2 megahertz.

To minimize the noise equivalent input signal of amplifier 45, a floating gate sense node 32 is used. The floating gate 32 senses the charge passing beneath it in the serial output register 27 and drives a field effect transistor 47. The capacitance of floating gate 32 may be lessened by narrowing the width of the serial output register 27 as shown schematically in FIG. 1. Narrowing the width of channel 27 permits reducing the size of node 32 and thereby minimizes the input capacitance of amplifier 45. Reducing the input capacitance makes amplifier 45 more sensitive because in a charge coupled device floating gate amplifier $$V_{OUT} = K\, Q_{IN}/C_{IN}$$

where $V_{OUT}$ is the output voltage, $C_{IN}$ is the input capacitance of the amplifier and K is a constant related to the structure of the device. Reducing $C_{IN}$ will increase $V_{OUT}$.

By well-known and appropriate sizing of the transistors within amplifier 45, the desired amount of gain may be achieved. In one embodiment the gain of the first stage inverter comprised of transistors 47 and 48 is 10. The threshold voltage of transistor 47 will typically correspond to the depth of the potential wells of the buried channel charge coupled device process. The output of the first stage inverter comprised of transistors 47 and 48 is connected to a source-follower 49 designed for use with an external source impedance 50. In one embodiment impedance 50 is a 5,000 ohm resistor. Resistor 50 allows optimizing the noise equivalent input signal for any particular operational frequency by adjustment of the impedance.

The output signal from floating gate 31 is similarly supplied to the gate of a field effect transistor 53, which together with transistor 54 form a first stage inverter. A second stage inverter formed by transistors 55 and 56 drives a source follower 58 to produce an output signal at terminal OS1. As with amplifier 45, amplifier 44 includes an external impedance 59 which may be appropriately adjusted.

One terminal of a transistor 62 is connected to floating gate 31 to permit resetting. The gate of transistor 62 is controlled by a reset signal $\phi_R$ with a constant potential FGB applied to the other terminal of transistor 62. The reset signal turns on transistor 62 and quarantees that floating gate 31 is set to potential FGB. By periodic resetting, possible drift of the potential of gate 31 is eliminated. Floating gate 32 is connected through capacitor 63 to potential BE. Adjustment of potential BE adjusts the dc potential of floating gate 32. Signals $\phi_{A1}$ and $\phi_{A2}$ are applied to electrodes 65 and 66 immediately preceeding sense nodes 31 and 32, respectively. Electrodes 65 and 66 insure that the total charge to be sensed is beneath the sense nodes 31 and 32.

Table 1 lists typical design and performance parameters for preamplifiers 44 and 45. Note that the dynamic range of the pair of amplifiers is 50,000, that is, charge between $1 \times 10^6$ electrons and 20 electrons is sensed $(1 \times 10^6 \div 20 = 50,000)$.

TABLE 1

| | First Preamplifier 44 (First to sense charge packets) | Second Preamplifier 45 (Senses charge packets after they have been reduced in size |
|---|---|---|
| Type of amplifier | Resettable Floating Gate | Floating Gate |
| Max. sample frequency | ≅10 MHz | ≅2 MHz |
| Saturation input charge | ≅$10^6$ electrons | ≅$2 \times 10^5$ electrons |
| Floating gate capacitance (effective) | 0.15 pF | 0.07 pF |
| Responsivity | ≅2uV/el | ≅8uV/el |
| Linear output range | 1.5V | 700 mV |
| RMS noise equivalent input signal (1 MHz sample rate, with line-clamping) | ≅80 electrons | ≅20 electrons |

Figure 2:
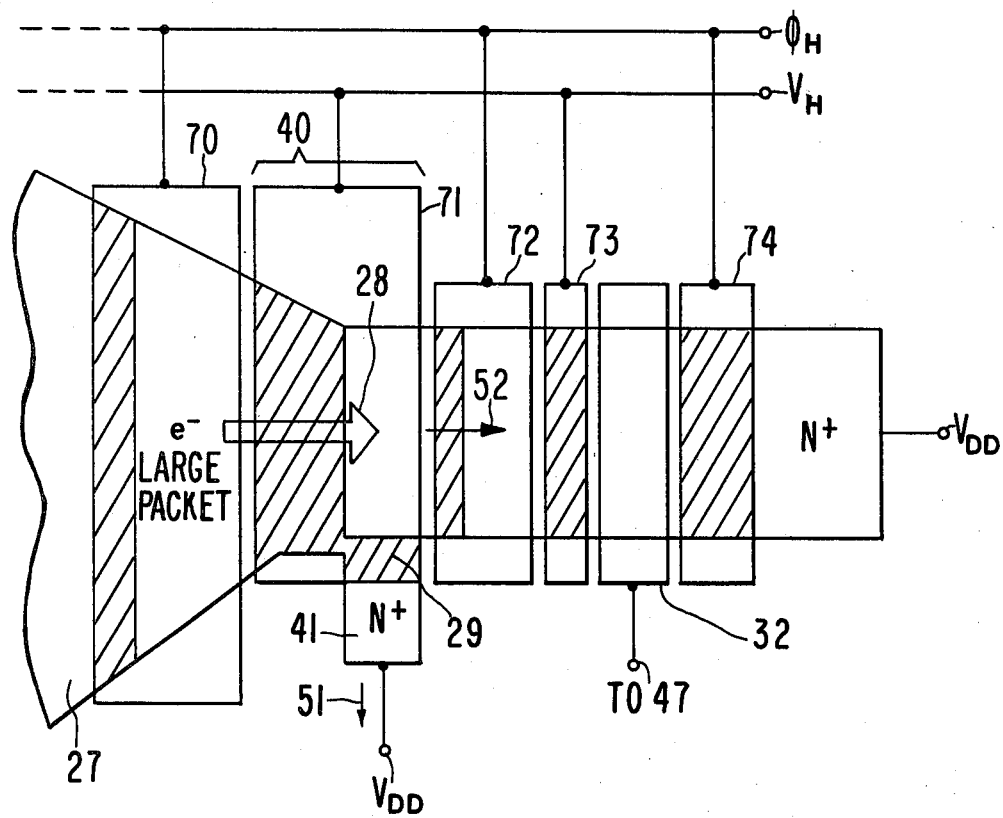
FIG. 2 is a schematic plan view of the output register in the vicinity of the charge limiting well between a first and a second sense node for two amplifiers.

To prevent charge in excess of the capacity of the well under floating gate 32 from overflowing and causing image blooming, a charge limiting well 40 is provided between node 31 and node 32. Overflow well 40 is shown in further detail in FIG. 2. To reduce the input capacitance to amplifier 45, register 27 tapers from a first width on the left-hand side of FIG. 2 to a second, narrower width on the right-hand side. Disposed along the length of register 27 are a series of overlying electrodes 70–74. Electrodes 70, 72, and 74 are connected to the control signal $\phi_H$ while electrodes 71 and 73 are connected to the control bias, $V_H$.

As is well known in charge coupled device technology, application of appropriate signals $\phi_H$ and $V_H$ will cause a packet of electrons to be transferred along register 27 in the direction of arrow 28. Overflow cell 40 is formed by adding a narrow overflow barrier 29 along one side of register 27 beneath electrode 71. Adjacent the barrier 29 an N+ region 41 acts as an overflow sink. By connecting N+ region 41 to a convenient positive voltage $V_{DD}$, electrons in excess of the desired amount are removed from the charge packets traveling beneath electrode 71. This is shown schematically in FIG. 2 by arrows 51 and 52 illustrating that a portion 51 of the initial charge 28 flows to $V_{DD}$ while the remaining charges 52 in register 27 passes beneath node 32. In the preferred embodiment charge in excess of $2 \times 10^5$ electrons is prevented from passing beneath floating gate amplifier sense node 32 in output register 27.

Figure 3:
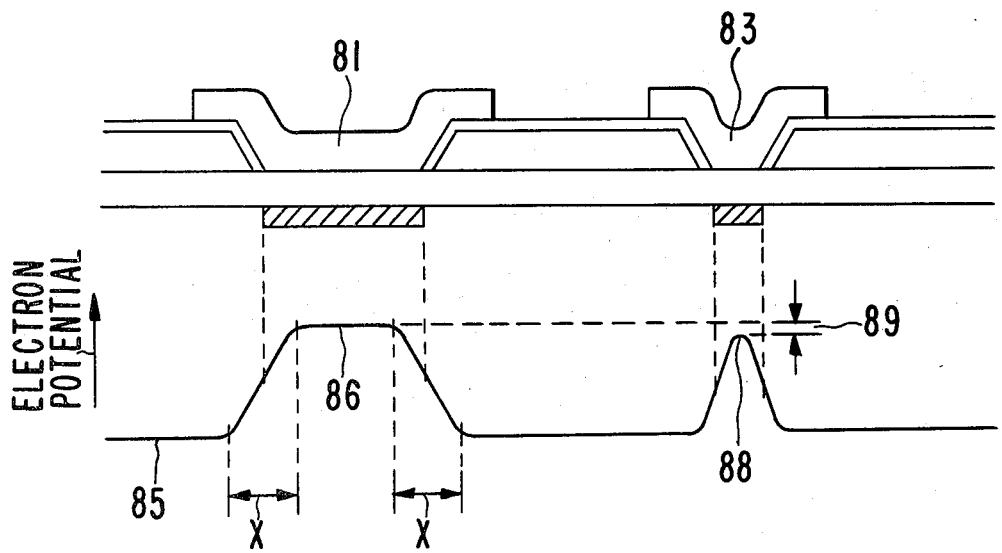
FIG. 3 is a schematic view showing how fringe fields may be used to create a charge limiting well to limit the charge flowing to the second amplifier from the first amplifier.

The barriers perpendicular to register 27 and the narrow barrier 29 along the edge of register 27 beneath electrode 71 all may be fabricated in a single process sequence because the fringe fields at the barriers will cause the narrower barrier to have a slightly lower potential height to electrons than the wider barrier beneath electrode 71. This is shown in FIG. 3 by a comparison of the barrier heights beneath a wider barrier gate 81 and a narrower barrier gate 83. The difference in electron potential beneath gate 81 and gate 83 arises from the transition distance X required for the electron potential to change from a lower value 85 to a higher value 86. Therefore, to change from low to high to low potential at least a distance of 2X is required. If the narrower gate 83 is less than 2X wide the electron potential will not reach the higher level 86 but will instead be at an intermediate level 88. The difference between level 88 and level 86 is the reduction in barrier heights 89 caused by the fringe fields. The slightly lower potential height 88 of the overflow barrier 29 prevents overflow of the electrons backward into the preceding register site.

Sense node 31 shown in FIG. 1 connected to amplifier 44 is resettable. The reset feature assures the stability of the sense node 31 over long periods of time. The floating gate sense node 31 may be reset as often as desired, however, in the preferred mode of operation node 31 is reset once every video line. To achieve charge to voltage gain of more than about 1 microvolt per electron at a data rate of 10 megahertz, amplifier 44 consists of a moderate gain first stage inverter comprised of transistors 53 and 54 with a two-stage source follower output comprised of transistors 55, 56 and 58. As shown in Table 1, the responsivity is approximately two microvolts per electron.

Figure 4:
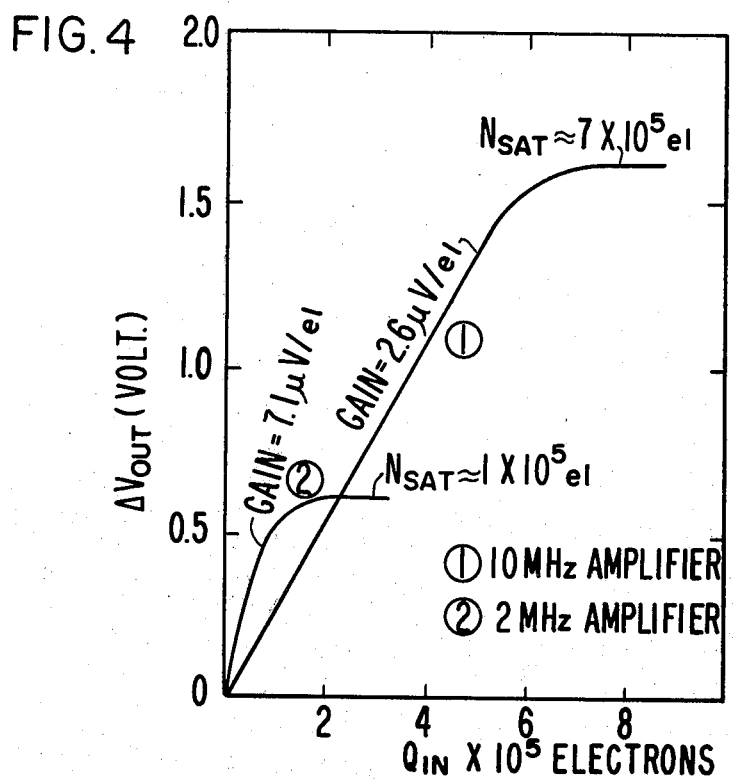
FIG. 4 is a graph showing typical transfer characteristics for one embodiment of this invention.

Representative transfer characteristics for the amplifiers 44 and 45 are shown in FIG. 4. In FIG. 4 the output voltages at nodes OS1 and OS2 of the amplifiers are shown as a function of the charge $Q_{IN}$ beneath the respective senses nodes 31 and 32. For a representative device of the embodiment shown in FIG. 1, the gain of the resetable floating gate amplifier is 2.6 microvolts per electron while the gain of the second floating gate amplifier is 7.1 microvolts per electron. The transfer characteristics shown in FIG. 4 are nearly linear at low signal levels, and then gradually enter saturation.

Figure 5:
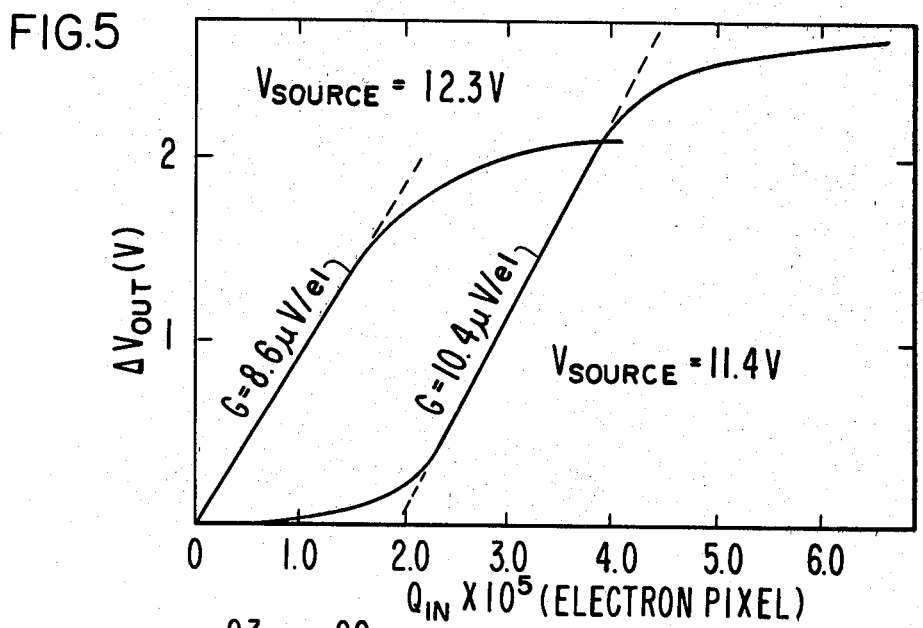
FIG. 5 is a graph showing how the transfer characteristics for an amplifier may be modified to maximize contrast enhancement at any desired input charge level to the amplifier.

One advantage of the amplifiers 44 and 45 in one embodiment of the invention is that contrast enhancement may be provided. Because amplifiers 44 and 45 have adjustable first stage source voltages VS1 and VS2, the voltages may be set independently to maximize the contrast enhancement at any desired input charge level. FIG. 5 shows one example of a modified transfer characteristic for contrast enhancement. With the source potential set at 12.3 volts an appropriate linear output signal is achieved over a charge input signal ranging from about 0 to $1.6 \times 10^5$ electrons per pixel. By decreasing the source potential to 11.4 volts the linear range is adjusted to extend from 2.2 to $4.0 \times 10^5$ electrons per pixel and a slightly greater gain achieved.

Figure 6:
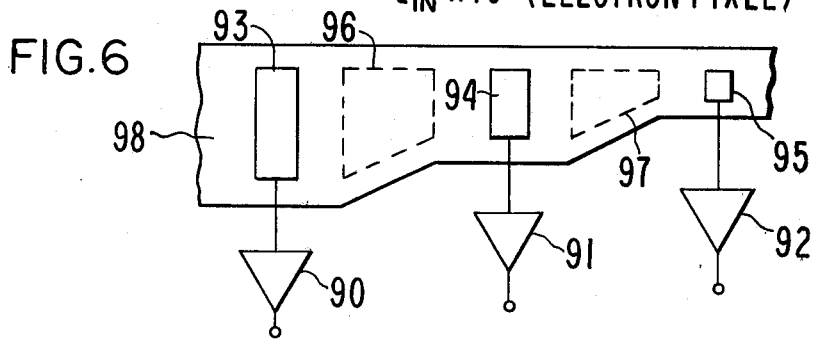
FIG. 6 is a schematic view of an embodiment of the invention using a plurality of both amplifiers and charge limiting wells.

FIG. 6 illustrates how a series of amplifiers 90, 91, 92 connected to sense nodes 93, 94, 95 and separated by progressively smaller charge limiting wells 96, 97 can provide a linear output for still more widely varying input conditions. As previously described the width of channel 98 and the size of progressive sense node 94 and 95 may be reduced to minimize the input capacitance to amplifiers 91 and 92.

Although one embodiment of the foregoing invention has been described, it is intended that various changes or modifications may be made to the embodiment within the scope of the appended claims. For example, different structures for limiting the charge flowing to subsequent amplifier stages may be used. Other applications and variations will also occur to those skilled in the art without departing from the scope of the invention as defined in the appended claims.

What is claimed is:

1. Apparatus for amplifying output signals comprising electrical charge in a serial output register in a charge coupled device, the apparatus comprising:
    first amplifier means for amplifying the output signals when they are supplied at a first location of the output register;
    at least one second amplifier means for amplifying the output signals when they are supplied to at least one location in the output register other than the first location; and
    signal limiting means disposed between the first location and at least one location other than the first location for limiting the output signals to a preselected amount after the output signals pass the first location.

2. Apparatus as in claim 1 wherein the signal limiting means removes charge in excess of a preselected amount.

3. Apparatus as in claim 2 wherein the signal limiting means includes a charge limiting well.

4. Apparatus as in claim 1 wherein the first amplifier means includes a first floating gate amplifier.

5. Apparatus as in claim 4 wherein the first floating gate amplifier is resettable.

6. Apparatus as in claim 4 wherein the at least one second amplifier means includes a second floating gate amplifier.

7. Apparatus as in claim 6 wherein the second floating gate amplifier includes a second sense node formed over the serial output register and is connected to a second field effect transistor.

8. Apparatus as in claim 7 further including a seventh and an eighth effect transistor wherein:
    the second sense node is connected to the gate of the second field effect transistor;
    the source of the second field effect transistor is connected to a third potential source and the drain of the second field effect transistor is connected to the gate and the source of the seventh field effect transistor and to the gate of the eighth field effect transistor;

the source of the eighth field effect transistor is connected through a second resistance to ground and to a second output terminal for supplying output signals; and the drains of the seventh and eighth field transistors are connected to the second potential source.

9. Apparatus as in claim 7 wherein the second field effect transistor is a portion of a second inverter.

10. Apparatus as in claim 9 wherein the output of the second inverter is connected to second source follower means.

11. Apparatus as in claim 9 wherein the source potential of the second inverter circuit may be varied.

12. Apparatus as in claim 4 wherein the first floating gate amplifier includes a first sense node formed over the serial output register and is connected to a first field effect transistor.

13. Apparatus as in claim 12 further including a third, a fourth, and a fifth field effect transistor wherein:

the first sense node is connected to the gate of the first field effect transistor;

the source of the first field effect transistor is connected to a first potential supply;

the drain of the first field effect transistor is connected to both the source and gate of the third field effect transistor and to the gate of the fourth field effect transistor;

the source of the fourth field effect transistor is connected to the drain of the fifth field effect transistor and to the gate of the sixth field effect transistor;

the gate and the source of the fifth field effect transistor are connected to ground potential;

the source of the sixth field effect transistor is connected through a first resistance to ground and to a first terminal for supplying output signals; and the drains of the third, fourth and sixth field effect transistor are connected to a second potential source.

14. Apparatus as in claim 12 wherein the first field effect transistor is a portion of a first inverter circuit.

15. Apparatus as in claim 14 wherein the output of the first inverter is connected to first source follower means.

16. Apparatus as in claim 14 wherein the source potential of the first inverter circuit may be varied.

* * * * *